US008361628B2

(12) United States Patent
Nakajima et al.

(10) Patent No.: US 8,361,628 B2
(45) Date of Patent: *Jan. 29, 2013

(54) PROCESS FOR PRODUCING METAL FILM

(75) Inventors: Seiji Nakajima, Kyoto (JP); Tetsuo Hayase, Kyoto (JP); Tetsuya Mori, Kyoto (JP)

(73) Assignee: OMRON Corporation, Kyoto (JP)

( * ) Notice: Subject to any disclaimer, the term of this patent is extended or adjusted under 35 U.S.C. 154(b) by 43 days.

This patent is subject to a terminal disclaimer.

(21) Appl. No.: 12/675,579

(22) PCT Filed: Nov. 14, 2008

(86) PCT No.: PCT/JP2008/070797
§ 371 (c)(1),
(2), (4) Date: Feb. 26, 2010

(87) PCT Pub. No.: WO2009/084337
PCT Pub. Date: Jul. 9, 2009

(65) Prior Publication Data
US 2010/0239874 A1    Sep. 23, 2010

(30) Foreign Application Priority Data
Dec. 27, 2007 (JP) ................................. 2007-338263

(51) Int. Cl.
B32B 15/08 (2006.01)
B32B 15/04 (2006.01)
B05D 3/10 (2006.01)
C08G 63/00 (2006.01)

(52) U.S. Cl. ........ 428/457; 428/461; 428/458; 427/341; 427/551; 427/537; 427/256; 427/277; 526/318.4; 359/838

(58) Field of Classification Search .................. 428/458, 428/457, 461; 427/341, 551, 537, 256, 277; 359/838; 526/318.4
See application file for complete search history.

(56) References Cited

U.S. PATENT DOCUMENTS

| 8,071,178 | B2 * | 12/2011 | Nakajima et al. ............ 427/508 |
| 2002/0086223 | A1 | 7/2002 | Hattori et al. |
| 2002/0094483 | A1 | 7/2002 | Hattori et al. |
| 2003/0087119 | A1 | 5/2003 | Iwabuchi et al. |
| 2003/0146709 | A1 | 8/2003 | Ohta et al. |
| 2003/0149187 | A1 | 8/2003 | Kano et al. |
| 2005/0019502 | A1 | 1/2005 | Kano et al. |
| 2009/0038957 | A1 * | 2/2009 | Sakakihara et al. .......... 205/571 |
| 2009/0202850 | A1 | 8/2009 | Mori et al. |
| 2010/0215979 | A1 | 8/2010 | Nakajima et al. |

FOREIGN PATENT DOCUMENTS

| CN | 1365135 A | 8/2002 |
| CN | 1405580 A | 3/2003 |
| CN | 101065518 | 2/2009 |
| JP | 60-238497 A | 11/1985 |
| JP | 7-011449 A | 1/1995 |
| JP | 09-150477 A | 6/1997 |
| JP | 2001-073159 A | 3/2001 |
| JP | 2003-013245 A | 1/2003 |
| JP | 2003-151366 A | 5/2003 |
| JP | 2003-213437 A | 7/2003 |
| JP | 2004-351722 A | 12/2004 |
| JP | 2005-248205 A | 9/2005 |
| JP | 2005248205 A * | 9/2005 |
| JP | 2006-130877 A | 5/2006 |
| JP | 2008007808 A | 1/2008 |
| WO | 2006/132241 A1 | 12/2006 |
| WO | WO 2006132241 A1 * | 12/2006 |
| WO | 2008/001611 A1 | 1/2008 |

OTHER PUBLICATIONS

Patent Abstracts of Japan, Publication No. 2003-013245, dated Jan. 15, 2003, 1 page.
Patent Abstracts of Japan, Publication No. 2005-248205, dated Sep. 15, 2005, 1 page.
Patent Abstracts of Japan, Publication No. 2001-073159, dated Mar. 21, 2001, 1 page.
International Search Report issued in PCT/JP2008/070797, mailed on Feb. 24, 2009, with translation, 4 pages.
Written Opinion issued in PCT/JP2008/070797, mailed on Feb. 24, 2009, 3 pages.
Chinese Office Action in Chinese Patent Application No. 200880105171.3 mailed Feb. 24, 2011 and English Translation thereof, 20 pages.
Office Action in U.S. Appl. No. 12/675,438; dated Sep. 30, 2011 (18 pages).
Office Action in U.S. Appl. No. 12/304,220; dated Sep. 29, 2011 (15 pages).
International Search Report issued in PCT/JP2008/070793, mailed on Feb. 24, 2009, with translation, 5 pages.
Written Opinion issued in PCT/JP2008/070793, mailed on Feb. 24, 2009, 3 pages.
International Search Report issued in PCT/JP2007/061896, mailed on Sep. 25, 2007, with translation, 7 pages.
Written Opinion issued in PCT/JP2007/061896, mailed on Sep. 25, 2007, 3 pages.
Patent Abstracts of Japan, Publication No. 60-238497, dated Nov. 27, 1985, 1 page.
Chinese Office Action in Chinese Patent Application No. 200880105171.3 mailed Dec. 13, 2011 and English Translation thereof, 6 pages.

(Continued)

Primary Examiner — Michael M Bernshteyn
(74) Attorney, Agent, or Firm — Osha Liang LLP

(57) ABSTRACT

The present invention provides (i) a process for producing a metal film with which process a metal film and a metal pattern can be formed, at low cost, on an arbitrary substrate, (ii) a primer composition, (iii) a metal film, and (iv) use of the metal film. The process includes the steps of: forming an organic film with use of a primer composition which contains (i) an addition polymerizable compound including three or more reactive groups, (ii) an addition polymerizable compound including an acid group, (iii) an addition polymerizable compound including a basic group, and (iv) an addition polymerizable compound including a hydrophilic functional group; form a metal (M1) salt from the acid group; substituting the metal (M1) salt of the acid group with a metal (M2) salt by processing with a metal (M2) ion aqueous solution containing a metal (M2) ion which has a less ionization tendency than the metal (M1) ion; and reducing the metal (M2) ion so that a metal film is formed on a surface of the organic film.

12 Claims, No Drawings

OTHER PUBLICATIONS

"New type of non-conductive electroplating NCVM," Pei Chunhua, Xiamen Technology, Issue 5 in 2007, paragraph 2 in right column of p. 41, published on Oct. 15, 2007 (3 pages).
www.iCAx.org, "Ask for the key uses of NCVM in the prior art," published on Apr. 15, 2007 (5 pages).
Chinese Office Action in Chinese Patent Application No. 200980132045.1 mailed Mar. 19, 2012 and English Translation thereof, 15 pages.
International Search Report w/ translation from PCT/JP2009/004502 dated Nov. 10, 2009 (2 pages).
Written Opinion from PCT/JP2009/004502 dated Nov. 10, 2009 (3 pages).
Office Action in U.S. Appl. No. 13/059,718; dated Feb. 18, 2011 (15 pages).

* cited by examiner

PROCESS FOR PRODUCING METAL FILM

TECHNICAL FIELD

The present invention relates to a process for producing a metal film, a primer composition, a metal film, and use of the metal film. In particular, the present invention relates to (i) a process for producing, at low cost, a metal film with a film thickness of tens of nanometers to hundreds of nanometers directly on an arbitrary resin film, without using a catalyst which is generally required in electroless plating, (ii) a primer composition used in the process, (ii) a metal film produced by the process, and (iv) use of the metal film.

BACKGROUND ART

Conventionally, it is known that processes for producing a metal film encompass, for example, vapor deposition, sputtering, and ion plating which are called dry processing, and electrolytic plating and electroless plating which are called wet processing. The dry processing requires expensive equipment, and the wet processing has difficulty in forming a metal film which has a thickness of tens of nanometers to hundreds of nanometers.

In view of the problem, a technique is disclosed in which, after a cation-exchange group is generated by modifying a polyimide resin, a metal ion is fixed to the cation-exchange group, and then the metal ion is reduced, whereby a metal film is formed (see Patent Literature 1).
Patent Literature 1
Japanese Patent Application Publication, Tokukai, No. 2001-73159 A (Publication Date: Mar. 21, 2001)

SUMMARY OF INVENTION

If films of various kinds of metals can sufficiently and cheaply be formed on an arbitrary substrate, a substrate which has excellent electrical conductivity can be obtained at low cost. Such a substrate is highly useful because the substrate is widely applicable to an electronic component, a sensor, or the like. However, a technique for producing such a substrate has not been found until now.

For example, the method disclosed in Patent Literature 1 includes a technique in which a cation-exchange group is generated by modifying a polyimide resin, and then a metal ion is fixed to the cation-exchange group. However, the cation-exchange group has low ion sensitivity, and also, the cation-exchange group is hardly compatible with an aqueous solution containing a metal ion. Further, the number of the cation-exchange group is small, whereby metal such as Au which has a large valence cannot sufficiently be formed into a film. As a result, there occurs a problem that sufficient electrical conductivity cannot be obtained.

Moreover, according to the method disclosed in Patent Literature 1, a film is formed by modifying polyimide. Accordingly, a metal film cannot be formed on an arbitrary substrate, and this leads to a problem of low applicability. It may be possible to form a metal film in such a manner that a film which has been formed by applying polyimide varnish to an arbitrary substrate and then hardening the applied varnish is modified. However, it is required to apply high temperature for hardening the polyimide resin. Accordingly, a substrate which can be used is limited to a substrate which has high heat resistance. That is, a substrate having low heat resistance cannot be used because such a substrate will be deformed due to high temperature (e.g., 200° C. or more) baking which is required for hardening the polyimide resin.

Further, according to the method disclosed in Patent Literature 1, a principle is adopted in which the polyimide is modified and a metal film is formed therein. With the principle, a two-dimensional metal wiring pattern can be produced but a three-dimensional pattern having an aspect ratio cannot be produced. This leads to a problem of low applicability.

Moreover, a substrate on which a metal film is formed by the method disclosed in Patent Literature 1 has problems of low transparency and browning of the substrate.

Further, according to the method disclosed in Patent Literature 1, a photolithographic method (patterning using a mask) is required for forming metal wiring. This raises problems of requirement for expensive equipment and of low throughput capacity.

The present invention is accomplished in view of the problems, and an object of the present invention is to provide (i) a process for producing a metal film with which process a metal film and a metal pattern can be formed, at low cost, on an arbitrary substrate, (ii) a primer composition, (iii) a metal film, and (iv) use of the metal film.

In view of the object, the inventors have eagerly examined: a primer composition containing a functional group which is highly retentive of a metal (M2) ion; promotion of fixing the metal (M2) ion to an organic film; prevention of elution of a metal (M2) fixed to the organic film; improvement of reduction efficiency of the metal (M2); improvement of reactivity between processing solvents and a primer; and the like. As a result, the inventors have found a process for producing a metal film with which process films made of various kinds of metals such as gold can be properly and easily formed on an arbitrary substrate. Further, with the process, even a three-dimensional metal wiring pattern can be formed. This finding ultimately leads to accomplishment of the present invention.

That is, a process for producing a metal film of the present invention includes the steps of: (a) forming an organic film by (i) applying a primer composition to a substrate or a film and thereafter (ii) polymerizing the primer composition, the primer composition containing (i) an addition polymerizable compound including three or more reactive groups, (ii) an addition polymerizable compound including an acid group, (iii) an addition polymerizable compound including a basic group, and (iv) an addition polymerizable compound including a hydrophilic functional group; (b) forming a metal (M1) salt from the acid group by processing the organic film with an aqueous solution containing a metal (M1) ion; (c) substituting the metal (M1) salt of the acid group with a metal (M2) salt by processing the organic film, which has been processed with the aqueous solution containing the metal (M1) ion, with a metal (M2) ion aqueous solution containing a metal (M2) ion which has a less ionization tendency than the metal (M1) ion; and (d) reducing the metal (M2) ion so that a metal film is formed on a surface of the organic film.

The organic film generated by the step (a) (organic film forming step) in the process of the present invention has a bulky three-dimensional structure (hereinafter, referred to as a "bulky structure"), as compared to polyimide, due to the addition polymerizable compound including three or more reactive groups. The bulky structure allows the organic film to fix many metal (M2) ions in a space in the film.

Accordingly, it seems that the organic film is capable of fixing more metal ions, as compared to a case where polyimide is used. Moreover, it also seems that, structurally, a reducing agent can reach inside the organic film, whereby metal (M2) ions inside the organic film can be reduced.

Further, the addition polymerizable compound including a hydrophilic functional group can improve hydrophilicity of the organic film. Accordingly, the processing solvents (i.e., the aqueous solution containing a metal (M1) ion, the metal (M2) ion aqueous solution containing a metal (M2) ion, and an aqueous solution of the reducing agent) can exert their actions inside the organic film. Therefore, the processing solvents can efficiently act on the organic film.

Unlike polyimide, the organic film does not have thermosetting property, but can be hardened by an ultraviolet ray. Accordingly, the organic film is applicable to even a substrate having low heat resistance.

In the step (b) (metal salt generating step), the acid group in the organic film is used for generating a metal (M1) salt. In the step (c) (metal fixing step), the organic film is processed with the metal ion aqueous solution containing a metal (M2) ion which has a less ionization tendency than that of the metal (M1) ion. The difference of ionization tendencies between the metal (M1) and the metal (M2) facilitates fixing of the metal (M2) ion.

Accordingly, metal wiring can be formed easily on a substrate, without using a photolithographic method.

Moreover, the addition polymerizable compound including a basic group drastically improves electrical conductivity of a metal film obtained by the present invention. This seems to be because the basic group facilitates compatibility between a surface of the primer composition and the aqueous solution containing a metal (M1) ion, whereby reaction efficiency between the primer composition and the aqueous solution is improved.

According to the process of the present invention having the features, a metal film which has high electrical conductivity and is formed directly on an arbitrary substrate can be produced efficiently and at low cost.

Note that, in a case where tin is used as a metal (M2), electrical conductivity cannot be obtained but a metal film which can be used as a half mirror can be formed.

According to the process of the present invention, it is preferable that the acid group includes one or more functional groups selected from a group consisting of a carboxyl group, a sulfonic acid group, a phenolic group, a benzoic acid group, a phthalic acid group, a salicylic acid group, an acetylsalicylic acid group, and a benzenesulfonic acid group.

The functional group is strongly acidic and includes an electron attracting group. Accordingly, in the acid group including the function group, ion exchange is easily carried out between the metal (M1) ion and the metal (M2) ion, whereby the metal (M2) can be fixed more easily. Therefore, a metal film can be produced more efficiently.

According to the process of the present invention, it is preferable that the basic group includes one or more functional groups selected from a group consisting of an amino group, a pyridyl group, a morpholino group, and an anilino group.

According to the process of the present invention, it is preferable that at least one of the reactive groups includes an acryloyl group and/or a methacryloyl group.

Each of the acryloyl group and the methacryloyl group is a functional group which easily constitutes a bulky structure. Accordingly, each of the acryloyl group and the methacryloyl group allows the organic film to have a structure with which (i) more metal ions can be fixed and (ii) a reducing agent can reach further inside the organic film. Therefore, it seems that the metal (M2) ion in further inside the organic film can be reduced.

According to the process of the present invention, it is preferable that the hydrophilic functional group includes an ethylene oxide group and/or a propylene oxide group.

Among hydrophilic functional groups, each of the ethylene oxide group and the propylene oxide group has particularly excellent capability to improve hydrophilicity of the organic film, thereby allowing the processing solvents to exert their actions further inside the organic film. Accordingly, the processing solvents can act on the organic film more effectively.

According to the process of the present invention, it is preferable that the metal (M1) is potassium or sodium.

According to the configuration, potassium or sodium has an extremely high ionization tendency, which is far different from that of the metal (M2). Accordingly, in the step (c), the metal (M2) can be fixed more easily. This makes it possible to produce a metal film more efficiently.

According to the process of the present invention, it is preferable that the metal (M2) is gold, silver, copper, palladium, tin, or nickel. Gold, silver, copper, palladium, or nickel has excellent electric conductivity, whereby a metal film including these is especially suitable for a material used in an electronic component, a sensor, or the like. In a case where the metal (M2) is tin, an obtained metal film does not have electric conductivity, but a half mirror can be provided. In general, a half mirror can be produced by a thermal transferring method or a sputtering method, in which methods energy such as heat is applied to a substrate. Accordingly, in a case where a resin substrate is used as the substrate, the resin substrate is warped. On the other hand, according to the process of the present invention, wet processing can be used for reducing load such as heat on the substrate. This makes it possible to produce a half mirror without causing warpage of a substrate.

According to the process of the present invention, films of the metals can be produced efficiently. This contributes greatly to promotion of efficiency in producing an electronic component, a sensor, a half mirror, or the like.

According to the process of the present invention, it is preferable that the metal (M2) ion aqueous solution includes an alkali metal ion and/or an alkaline earth metal ion. Each of the alkali metal and the alkaline earth metal has an extremely high ionization tendency. Accordingly, the metal (M2) ion aqueous solution containing an alkali metal ion and/or an alkaline earth metal ion can facilitate ion exchange between the metal (M1) ion and the metal (M2) ion in the step (c).

According to the process of the present invention, it is preferable that the metal (M2) ion aqueous solution includes polyol. In general, the metal (M2) ion has large specific gravity. Accordingly, in a case where the metal (M2) ions present particularly in high concentration, the metal (M2) ions are easily precipitated regardless of compatibility with a solvent. On the other hand, according to the configuration of the present invention, polyol such as glycerine is highly viscous, whereby a metal (M2) ion aqueous solution containing the polyol hardly causes the metal (M2) ion to be precipitated. Accordingly, the ion exchange in the step (c) can be carried out efficiently.

According to the process of the present invention, it is preferable that, in the step (d) (reducing step), the metal (M2) ion is reduced with use of (i) one or more reducing agents selected from a group consisting of (1) ascorbic acid, sodium ascorbate, sodium boron hydride, dimethylamine-borane, trimethylamine-borane, citric acid, sodium citrate, tannic acid, diborane, hydrazine, formaldehyde, and lithium hydride aluminum, (2) a derivative of each of the compounds in (1), and (3) sulfite salt and hypophosphite, and/or (ii) one or more reducing means selected from a group consisting of (4) an ultraviolet ray, heat, plasma, and hydrogen.

According to the configuration, the metal (M2) ion can be reduced by the reducing agent, ultraviolet ray, or the like, whereby a metal atom of the metal (M2) ion can be precipitated on a surface of the organic film. This makes it possible to form a predefined metal film.

According to the process of the present invention, it is preferable that, in the step (d), in a case where said one or more reducing agents selected from the group consisting of (1), (2), and (3) are used, the metal (M2) ion is reduced in a presence of alkali metal and/or alkaline earth metal.

The alkali metal and the alkaline earth metal have much higher ionization tendencies than that of the metal (M2) used in the present invention. Therefore, the configuration prevents the metal (M2), which has been fixed to the organic metal in the step (c), from being ionized and eluted. This makes it possible to produce, more efficiently, a metal film which has excellent electrical conductivity.

According to the process of the present invention, it is preferable that, in the step (d), the reducing agent is used together with alcohol and/or a surface active agent. In a case where the reducing agent is used in the step (d), it is preferable to carry out efficient reduction by causing the reducing agent to reach as far inside the primer composition as possible. However, for example, a water-soluble reducing agent such as ascorbic acid has difficulty in reaching inside the metal film and the primer composition due to its water solubility.

According to the configuration, in the step (d), the alcohol and/or the surface active agent are/is used together with the reducing agent. Lipophilicity of the alcohol and/or the surface active agent facilitates compatibility between the water-soluble reducing agent and the primer composition, whereby reduction inside the primer composition can be carried out sufficiently. Accordingly, a metal film can be produced more efficiently.

According to the process of the present invention, it is preferable that, in the step (a), the organic film is given a shape by printing or nanoimprinting.

According to the process of the present invention, the primer composition is applied to an arbitrary substrate so that the primer composition has an arbitrary shape and can be easily hardened, with use of a simple method such as printing (ink-jet printing, screen printing, or the like) or nanoimprinting. Accordingly, metal wiring can be formed without using a photolithographic method which requires expensive equipment. This allows metal wiring to be obtained with high-throughput, at low cost, and easily.

A primer composition of the present invention includes: an addition polymerizable compound including three or more reactive groups; an addition polymerizable compound including an acid group; an addition polymerizable compound including a basic group; and an addition polymerizable compound including a hydrophilic functional group.

According to the configuration, the primer composition has a bulky structure and moderate water solubility, whereby more metal ions can be fixed, as compared to a case where polyimide is used. Moreover, the primer composition which includes the addition polymerizable compound including an acid group allows a metal (M1) ion and a metal (M2) ion to be easily exchanged, whereby the metal (M2) can be fixed easily. Further, the primer composition which includes the addition polymerizable compound including a basic group can raise reaction efficiency of (i) a reaction of substituting a hydrogen ion with the metal (M1) ion and (ii) a reaction of fixing the metal (M2) ion to the organic film. Therefore, the primer composition is extremely useful as a material for producing a metal film.

A metal film of the present invention is produced by the process of the present invention. As described above, the process can efficiently form a metal film on an arbitrary substrate, whereby the metal film of the present invention can be formed on an arbitrary substrate and exert excellent electrical conductivity. Therefore, the metal film is extremely useful as a constituent material of an electronic component, a sensor, or the like.

An electronic component of the present invention includes a metal film produced by the process of the present invention. The metal film is formed, with a film thickness of tens of nanometers to hundreds of nanometers, on an arbitrary substrate. Further, the metal film can exert excellent electrical conductivity. Therefore, the electronic component of the present invention can exert excellent electrical conductivity.

A half mirror of the present invention includes a metal film produced, with use of tin as the metal (M2), by the process of the present invention. According to the process, tin can be extremely easily formed into a film on an arbitrary substrate. The obtained metal film does not have electrical conductivity but has a property of partially reflecting and partially transmitting incident light. This property leads to an excellent characteristic as a half mirror. Therefore, a half mirror can be provided at low cost. Moreover, it is possible to provide a half mirror whose substrate is hardly warped, even in a case where a resin substrate is used as the substrate of the half mirror.

For a fuller understanding of the nature and advantages of the invention, reference should be made to the ensuing detailed description taken in conjunction with the accompanying drawings.

DESCRIPTION OF EMBODIMENTS

The following describes an embodiment of the present invention. However, the present invention is not limited to this embodiment.

[1. Process for Producing a Metal Film According to the Present Invention]

In the present embodiment, a process of a metal film includes the steps of: (a) forming an organic film by (i) applying a primer composition to a substrate or a film and thereafter (ii) polymerizing the primer composition, the primer composition containing (i) an addition polymerizable compound including three or more reactive groups, (ii) an addition polymerizable compound including an acid group, (iii) an addition polymerizable compound including a basic group, and (iv) an addition polymerizable compound including a hydrophilic functional group; (b) forming a metal (M1) salt from the acid group by processing the organic film with an aqueous solution containing a metal (M1) ion; (c) substituting the metal (M1) salt of the acid group with a metal (M2) salt by processing the organic film, which has been processed with the aqueous solution containing the metal (M1) ion, with a metal (M2) ion aqueous solution containing a metal (M2) ion which has a less ionization tendency than the metal (M1) ion; and (d) reducing the metal (M2) ion so that a metal film is formed on a surface of the organic film. The following describes the steps.

(1-1. Organic Film Forming Step)

In an organic film forming step, an organic film is formed by applying a primer composition to a substrate or a film, and then polymerizing the applied primer composition. The primer composition contains: an addition polymerizable compound including three or more reactive groups; an addition polymerizable compound including an acid group; an addition polymerizable compound including a basic group; and an addition polymerizable compound including a hydrophilic functional group.

The primer composition is used for forming a primer (resin film) for precipitating a metal (M2) ion, which is added in a metal fixing step (described later), on a surface of the primer so as to form an intended metal film.

Each of the addition polymerizable compound including three or more reactive groups, the addition polymerizable compound including an acid group, the addition polymerizable compound including a basic group, and the addition polymerizable compound including a hydrophilic functional group includes a polymerizable unsaturated bond, in particular, includes at least one polymerizable double bond per a molecule. Note that the "addition polymerizable compound" in this specification indicates a compound which can be addition-polymerized by activation energy such as an ultraviolet ray, plasma, or an electron beam. The addition polymerizable compound may be a monomer, an oligomer, or a polymer.

The "addition polymerizable compound including three or more reactive groups" is used for providing the primer composition with a bulky structure. The primer composition which has a bulky structure allows the organic film to have a high-bulk three dimensional structure (bulky structure) due to the compound, as compared to a case where polyimide is used. Accordingly, a lot of metal (M2) ions can be fixed to the organic film in the metal fixing step (described later), and the metal (M2) ion contained in the film can easily contact with a reducing agent or an ultraviolet ray.

The "reactive group" indicates an addition polymerizable reactive group which can carry out addition polymerization such as radical polymerization or cationic polymerization. The reactive group is not limited in particular but may be, for example, an acryloyl group, a methacryloyl group, an acrylamide group, a vinyl group, or an allyl group. Among these, at least one of the acryloyl group and the methacryloyl group is preferably used because each of these is a functional group which easily constitutes a bulky structure. Accordingly, it is preferable that the reactive group, which is included in the addition polymerizable compound including three or more reactive groups, contains an acryloyl group and/or a methacryloyl group.

Moreover, a branched structure, due to a plurality of the reactive groups, of the addition polymerizable compound provides the addition polymerizable compound with a bulky structure. Accordingly, the number of the reactive groups is not limited in particular as long as the number is three or more.

The addition polymerizable compound including three or more reactive groups is not particularly limited in terms of its structure as long as the addition polymerizable compound includes three or more addition polymerizable reactive groups per a molecule. However, for example, the addition polymerizable compound including three or more reactive groups may be a compound represented by a formula (1) below.

(R1—R2)n—R3     (1)

(In the formula (1): "n" represents three or more; "R1" represents an addition polymerizable reactive group selected from a group consisting of an acryloyl group, a methacryloyl group, an acrylamide group, a vinyl group, and an allyl group; "R2" represents an arbitrary structure including, for example, an ester group, an alkyl group, an amide group, an ethylene oxide group, and a propylene oxide group; and "R3" represents C, an alkyl group, or C—OH.)

More specifically, the addition polymerizable compound including three or more reactive groups may be, for example, trimethylolpropane triacrylate (as a commercial product, e.g., TMP-A manufactured by Kyoeisha Chemical Co., Ltd.), pentaerythritol triacrylate (as a commercial product, e.g., PE-3A manufactured by Kyoeisha Chemical Co., Ltd.), pentaerythritol tetracrylate (as a commercial product, e.g., PE-4A manufactured by Kyoeisha Chemical Co., Ltd.), dipentaerythritol hexaacrylate (as a commercial product, e.g., DPE-6A manufactured by Kyoeisha Chemical Co., Ltd.), pentaerythritol triacrylate isophorone diisocyanate urethane prepolymer (as a commercial product, e.g., UA306I manufactured by Kyoeisha Chemical Co., Ltd.), or dipentaerythritol pentaacrylate hexamethylene diisocyanate urethane prepolymer (as a commercial product, e.g., UA-510H manufactured by Kyoeisha Chemical Co., Ltd.).

The "addition polymerizable compound including three or more reactive groups" may be used singularly or in a combination of two or more kinds of it.

A content of the "addition polymerizable compound including three or more reactive groups" in the primer composition is not limited in particular. However, it is preferable that the content is 1% by weight or more but 60% by weight or less with respect to a total amount of the primer composition. Further, it is more preferable that the content is 5% by weight or more but 50% by weight or less. Increasing the content of the addition polymerizable compound would enhance effects of fixing a metal (M2) ion to the primer composition and reducing a metal (M2) ion due to the bulky structure of the addition polymerizable compound, but at the same time would decrease proportions of the addition polymerizable compound including an acid group, the addition polymerizable compound including a basic group, and the addition polymerizable compound including a hydrophilic functional group in the primer composition, whereby effects provided by the compounds would be reduced. Therefore, the content of the "addition polymerizable compound including three or more reactive groups" in the primer composition is preferably within the above range.

An acid group contained in the "addition polymerizable compound including an acid group" is not limited in particular as long as the acid group is capable of retaining a metal ion in a form of a salt. For example, the acid group may be a phenolic group, a benzoic acid group, a benzenesulfonic acid group, a carboxyl group, a sulfonic acid group, a hydroxyl group, a phthalic acid group, a salicylic acid group, or an acetylsalicylic acid group.

The inventors have found that a strongly acidic acid group particularly is excellently retentive of a metal ion and is extremely advantageous for producing a metal film. Accordingly, it is preferable that the acid group is a strongly acidic acid group. It is particularly preferable that the strongly acidic acid group includes one or more functional groups selected from a group consisting of a carboxyl group, a sulfonic acid group, a phenolic group, a benzoic acid group, a phthalic acid group, a salicylic acid group, an acetylsalicylic acid group, and a benzenesulfonic acid group, since these groups are excellently retentive of a metal ion.

At least one of the acid groups contained in the "addition polymerizable compound including an acid group" needs to be located at a molecular end. The "molecular end" may be an end of a main chain or an end of a side chain. In a metal salt generating step of the present invention, a metal (M1) ion needs to be trapped by a free acid group located at a molecular end of the compound. Accordingly, at least one of the acid groups needs to be located at a molecular end. An acid group located at a molecular end exists in a molecule as an acid group even after addition polymerization. The acid group is processed by an aqueous solution containing a metal (M1) ion, thereby forming a metal (M1) salt in the subsequent metal salt generating step.

The acid group which exists at a position other than the molecular end may have a form of ester. That is, the "addition polymerizable compound including an acid group" may include, at a position other than the molecular end, an ester group obtained from the acid group. A group which constitutes the ester group is not limited in particular as long as an ester bond of the group can be hydrolyzed.

The group which constitutes the ester group may be, for example: a linear-chain or branched alkyl group such as a methyl group, an ethyl group, an n-propyl group, an isopropyl group, an n-butyl group, an isobutyl group, a sec-butyl group, or t-butyl group; an univalent aromatic hydrocarbon group such as a phenyl group; a univalent alicyclic hydrocarbon group such as an isobornyl group or an adamantyl group; a linear-chain or branched perfluoroalkyl group such as a perfluoromethyl group, a perfluoroethyl group, a perfluoro-n-propyl group, a perfluoroisopropyl group, a perfluoro-n-butyl group, a perfluoroisobutyl group, a perfluoro-sec-butyl group, or a perfluoro-t-butyl group; or an ether group such as an ethylene oxide group or a propylene oxide group. Note that the number of (i) the acid group in a molecule of the "addition polymerizable compound including an acid group", or (ii) an ester group thereof is not limited in particular.

The "addition polymerizable compound including an acid group" may be, for example, a compound represented by formula (2) or (3) below.

$$R1—R2—R3—COOH \quad (2)$$

$$R1—R2—R3—SO_3H \quad (3)$$

(In the formulae (2) and (3): "R1" represents an addition polymerizable reactive group selected from a group consisting of an acryloyl group, a methacryloyl group, an acrylamide group, a vinyl group, and an allyl group; "R2" represents an arbitrary structure including, for example, an ester group, an alkyl group, an amide group, an ethylene oxide group, and a propylene oxide group; and "R3" represents (i) a functional group having a cyclic structure such as a phenyl group or a cyclohexyl group, or (ii) a functional group such as an alkyl group which has a liner-chain structure or an alkylene group which has a branched structure.)

More specifically, the "addition polymerizable compound including an acid group" may be, for example: acrylic ester including (meth)acrylic acid, vinyl benzenecarboxylic acid, vinyl acetic acid, vinyl sulfonic acid, vinyl benzenesulfonic acid, maleic acid, fumaric acid, or ester of these; acrylic ester including a phthalic acid group such as 2-acryloyloxyethylphthalic acid; acrylic ester including a salicylic acid group; acrylic ester including an acetylsalicylic acid group; or vinylphenol. The "addition polymerizable compound including an acid group" may be used singularly or in a combination of two or more kinds of it.

A content of the "addition polymerizable compound including an acid group" in the primer composition is not limited in particular. However, it is preferable that the content is 10% by weight or more but 90% by weight or less with respect to a total amount of the primer composition. Further, it is more preferable that the content is 20% by weight or more but 70% by weight or less.

Increasing the content of the "addition polymerizable compound including an acid group" would allow the primer composition to retain more metal ions, but at the same time would decrease contents of the addition polymerizable compound including three or more reactive groups, the addition polymerizable compound including a basic group, and the addition polymerizable compound including a hydrophilic functional group, whereby effects provided by the compounds would be reduced. Therefore, the content of the "addition polymerizable compound including an acid group" is preferably within the above range.

The "addition polymerizable compound including a basic group" indicates an addition polymerizable compound including one or more basic groups per a molecule.

As described in Examples later, the inventors have found that the primer composition containing an "addition polymerizable compound including a basic group" allows a metal film produced by the process of the present invention to have drastically improved electrical conductivity, except in a case where tin is used as the metal (M2). Moreover, the inventers have also found that, in a case where tin is used as the metal (M2), an obtained metal film does not have electrical conductivity but has an excellent characteristic as a half mirror.

Note that the half mirror indicates glass or a synthetic resin which partially reflects and partially transmits incident light. An intensity ratio of reflected light to transmitted light is one to one.

From this, a basic group located at a molecular end seems to contribute to improvement of retentivity of a metal (M1) ion and a metal (M2) ion, because the "addition polymerizable compound including a basic group" seems to facilitate compatibility between the primer composition and an aqueous solution containing a metal (M1) ion.

The basic group is not limited in particular as long as the basic group allows an acid group to have higher retentivity of a metal (M1) ion. For example, the basic group may be primary through tertiary amino groups, a quaternary ammonium base, a pyridyl group, a morpholino group, an anilino group, an imidazole group, or a quaternary pyridinium base. In particular, it is preferable that the basic group is one or more functional groups selected from a group consisting of an amino group, a pyridyl group, a morpholino group, and an anilino group, because these groups hardly reduce radical polymerizability.

The "addition polymerizable compound including a basic group" may be, for example, a compound represented by a formula (4) below.

$$R1—R2—R3 \quad (4)$$

(In the formula (4): "R1" represents an addition polymerizable reactive group selected from a group consisting of an acryloyl group, a methacryloyl group, an acrylamide group, a vinyl group, and an allyl group; "R2" represents an arbitrary structure including, for example, an ester group, an alkyl group, an amide group, an ethylene oxide group, and a propylene oxide group; and "R3" represents a basic group.)

More specifically, the "addition polymerizable compound including a basic group" may be dimethylaminoethyl methacrylate, diethylaminoethyl methacrylate, N-acryloyl morpholine, N,N-dimethylacrylamide, N-(3-dimethylaminopropyl)methacrylamide.

A content of the "addition polymerizable compound including a basic group" in the primer composition is not limited in particular. However, it is preferable that the content is 1% by weight or more but 80% by weight or less with respect to a total amount of the primer composition. Further, it is more preferable that the content is 1% by weight or more but 50% by weight or less.

The "hydrophilic functional group" indicates a functional group which is highly compatible with an aqueous solution. The "hydrophilic functional group" may be, for example, an ethylene oxide group, a propylene oxide group, an acetal group, a hydroxyl group, or an ether group. In particular, an ethylene oxide group and/or a propylene oxide group are preferably used because these groups have excellent characteristics for improving hydrophilicity of the organic film. Accordingly, the hydrophilic functional group preferably contain an ethylene oxide group and/or a propylene oxide group.

The "addition polymerizable compound including a hydrophilic functional group" may be, for example, a compound represented by a formula (5) below.

R1—R2—R1    (5)

(In the formula (5): "R1" represents an addition polymerizable reactive group selected from a group consisting of an acryloyl group, a methacryloyl group, an acrylamide group, a vinyl group, and an allyl group; "R2" represents a hydrophilic functional group selected from a group consisting of, for example, an ethylene oxide group, a propylene oxide group, an acetal group, a hydroxyl group, and an ether group.)

More specifically, the "addition polymerizable compound including a hydrophilic functional group" may be, for example: polyethylene glycol diacrylate, polypropylene glycol diacrylate, glycerin diacrylate, polytetramethylene glycol diacrylate, 2-hydroxypropyl acrylate, diethylene glycol dimetacrylate. The "addition polymerizable compound including a hydrophilic functional group" may be used singularly or in a combination of two or more kinds of it.

A content of the "addition polymerizable compound including a hydrophilic functional group" in the primer composition is not limited in particular. However, it is preferable that the content is 1% by weight or more but 80% by weight or less with respect to a total amount of the primer composition. Further, it is more preferable that the content is 5% by weight or more but 50% by weight or less.

Increasing the content of the "addition polymerizable compound including a hydrophilic functional group" would enhance an effect of improving hydrophilicity of an organic film, but at the same time would decrease contents of the addition polymerizable compound including three or more reactive groups, the addition polymerizable compound including an acid group, and the addition polymerizable compound including a basic group, whereby effects provided by the compounds would be reduced. Therefore, the content of the "addition polymerizable compound including a hydrophilic functional group" is preferably within the above range.

As described above, the primer composition contains: an addition polymerizable compound including three or more reactive groups; an addition polymerizable compound including an acid group; an addition polymerizable compound including a basic group; and an addition polymerizable compound including a hydrophilic functional group. Accordingly, the primer composition is excellently retentive of a metal (M2) ion. In particular, gold is difficult to fix to a substrate by, for example, the technique disclosed in Patent Literature 1 which technique uses polyimide. On the other hand, use of the primer composition for forming an organic film on a substrate or a film allows even gold to be sufficiently fixed on an organic film. Moreover, silver, copper, palladium, tin, or nickel, as well as gold, is also excellently retentive of the metal (M2).

The primer composition is sufficient as long as the primer composition at least contains the addition polymerizable compound including three or more reactive groups, the addition polymerizable compound including an acid group, the addition polymerizable compound including a basic group, and the addition polymerizable compound including a hydrophilic functional group. The primer composition can be prepared by appropriately mixing these compounds with the use of a conventionally known method.

The primer composition preferably contain a polymerization initiator, in addition to the compounds. The polymerization initiator is not limited in particular as long as the polymerization initiator can polymerize a primer composition. The polymerization initiator may be, for example: a radical polymerization initiator such as a photopolymerization initiator or a thermal polymerization initiator; or an ion polymerization initiator such as a cationic polymerization initiator or anionic polymerization initiator. In particular, the radical polymerization initiator is preferably used. More particularly, the photopolymerization initiator is preferably used because the photopolymerization initiator, which does not use heat, can be applied to a substrate having low heat resistance.

The photopolymerization initiator is not limited in particular. However, the photopolymerization initiator may be, for example, 2-hydroxy-2-methyl-1-phenyl-propene-1-on, 2-methyl-1-[4-(methylthio) phenyl]-2-morpholinopropene-1-on, 2,4,6-trimethylbenzoyl-diphenyl-phosphinoxide, or triphenyl sulfonyl triflate.

The thermal polymerization initiator is not limited in particular. However, the thermal polymerization initiator may be, for example, cumene hydroperoxide, t-butyl hydroperoxide, benzoyl peroxide, DBU, ethylene diamine, N,N-dimethylbenzylamine. Note that the polymerization initiators may be used singularly or in combination thereof as appropriate.

A content of the polymerization initiator is 0.05% by weight to 10% by weight, and preferably 0.1% by weight to 8% by weight with respect to the total amount of the primer composition.

The primer composition may contain an addition polymerizable compound (hereinafter, referred to as "another addition polymerizable compound"), in addition to the addition polymerizable compound including three or more reactive groups, the addition polymerizable compound including an acid group, the addition polymerizable compound including a basic group, and the addition polymerizable compound including a hydrophilic functional group. The another addition polymerizable compound is a compound which (i) does not include an acid group or an ester group thereof but (ii) includes a polymerizable unsaturated bond, in particular, includes a single polymerizable double bond per a molecule. The another addition polymerizable compound may be, for example, styrene or vinylcyclohexane. A content of the another addition polymerizable compound is preferably 50% by weight or less and more preferably 30% by weight or less with respect to a total amount of the primer composition.

The primer composition may further contain an organic solvent. The organic solvent contained in the primer composition allows the primer composition to be applied to a substrate or a film more easily. The organic solvent is not limited in particular, but may be, for example, propylene glycol monomethyl ether acetate, propylene glycol monomethyl ether, cyclohexanone, or butyl acetate. A content of the organic solvent is preferably 80% by weight or less and more preferably 30% by weight or less with respect to a total amount of the primer composition.

Any substrate or film may be used. This is because the primer composition can be hardened by an ultraviolet ray, etc. and therefore (i) does not need to be baked at high temperature unlike the case where polyimide varnish is used, and (ii) can be appropriately applied to a substrate or a film which has low heat resistance. Moreover, it is not necessary to use expensive polyimide as a substrate, whereby cost of materials is extremely cheap, as compared to, for example, the invention disclosed in Patent Literature 1.

Examples of a material for the substrate or the film include an acrylic resin, a polyester resin, a polycarbonate resin, a polyethylene terephthalate, or an epoxy resin. Such a substrate or a film may be, for example, a glass substrate, quartz, lithium niobate, lithium tantalite, borosilicate glass, PZT, or PLZT.

A method of applying the primer composition to a substrate or a film is not limited in particular, but may be an arbitrary method of applying. For example, the method of applying may be an ink-jet method, screen printing, spin coating, spray coating, or dipping.

An applied thickness of the primer composition is not limited in particular. For example, the applied thickness may be adequately set so that a thickness of an organic film after polymerization remains within a range described later.

Polymerization may be carried out with use of, for example, a polymerization initiator, or an activation energy ray such as a radiation ray, an electron beam, an ultraviolet ray, or an electromagnetic beam. For example, in a case where a photopolymerization initiator is used, the photopolymerization initiator may be irradiated, at a side of a substrate or a film where the primer composition is applied, with light having a wavelength which allows the photopolymerization initiator which has absorbed the light to generate a radical. An example of the light is an ultraviolet ray.

Moreover, for example, in a case where a thermal polymerization initiator is used, the thermal polymerization initiator is heated up to temperature of, for example, 50° C. to 150° C. at which temperature the thermal polymerization initiator can be decomposed so as to generate a radical.

An organic film is formed on a substrate or a film by the polymerization. A film thickness of the obtained organic film is not limited in particular as long as the object of the present invention can be attained. For example, a film thickness of 0.1 µm through 1000 µm is appropriate. In particular, a film thickness of 10 µm through 500 µm is more appropriate.

According to the process of the present invention, the prime composition is used. Accordingly, in the organic film forming step, a metal wiring pattern can be directly transferred to an organic film, easily, by printing or nanoimprinting. Then, the primer composition is polymerized, whereby a desired pattern can be formed in the organic film. Ultimately, after a metal salt generating step, a metal fixing step, and a reducing step, a metal film having a desired pattern can be easily obtained.

With the configuration, a metal wiring pattern can be extremely easily formed directly on an organic film, and metal wiring can be provided at drastically low cost.

On the other hand, in a case where polyimide is used as the primer composition, as disclosed in Patent Literature 1, a pattern of a metal film needs to be formed by a photolithographic method. However, the photolithographic method requires expensive equipment, whereby a metal wiring pattern cannot be obtained at low cost.

As used herein, the photolithographic method indicates a method in which a photosensitive resin (photoresist) is applied to a surface of a wafer, the wafer is irradiated with light while being covered with a photomask on which a circuit pattern is formed so as to transfer a circuit configuration on the wafer and then the circuit configuration is developed to form a resist pattern.

As used herein, the nanoimprinting is a method in which recesses and projections on a mold, having sizes of tens of nanometers to hundreds of nanometers, are pressed to a resin material applied to a substrate, whereby a shape formed by the recesses and projections are transferred to the resin material.

Note that a metal film in which a desired pattern is formed can be obtained by the photolithographic method. For example, the primer composition is polymerized, while being covered with a mask, by being irradiated with an ultraviolet ray. Then, an unreacted monomer region is removed, so that an organic film which has a patterned shape corresponding to the mask can be formed. Further, the obtained organic film is processed in steps described later, whereby a metal film which has a three-dimensional patterned shape can be formed. Note that the unreacted monomer region can be removed by strong acid such as hydrochloric acid, nitric acid, or sulfuric acid.

(1-2. Metal Salt Generating Step)

A metal salt generating step is a step of converting the aforementioned acid group to the metal (M1) salt by treating the above-described organic film with an aqueous solution containing the metal (M1) ion. The treatment can easily be executed by, for example, dipping in the aqueous solution containing the metal (M1) ion a substrate or a film on which an organic film has been formed, or applying the aqueous solution containing the metal (M1) ion onto a substrate or a film on which an organic film has been formed.

The metal (M1) ion is a metal ion that is capable of cation exchange with the metal (M2) ion that is used for forming a metal film in a metal fixing step described below. That is, the metal (M1) ion is a metal ion that has a higher ionization tendency than the metal (M2) ion. The metal (M1) ion is not specifically limited as long as it is capable of cation exchange with the metal (M2) ion. The metal (M1) ion may be, for example, an alkali metal ion or an alkali earth metal ion. Among them, it is preferable that the metal (M1) ion be an alkali metal ion, or more preferably a potassium ion or a sodium ion in terms of ease of cation exchange.

In this specification, "ionization tendency" means a tendency that a metal is converted into a metal ion (positive ion) upon contact with water. The strength of an ionization tendency of a metal ion is based on the strength of a tendency that a metal is converted into the metal ion.

Examples of the aqueous solution containing the metal (M1) ion include an aqueous solution of potassium hydrate or sodium hydrate. A metal (M1) ion concentration in such an aqueous solution is not specifically limited as long as a metal salt of an acid group is produced. However, in the present invention, it is possible to effectively produce a metal salt of an acid group even in cases where the concentration is relatively low at 0.1 to 5 M, or preferably 0.5 to 2.5 M. Moreover, two or more kinds of the metal (M1) ions may be used in the present invention. In that case, it is preferable that the sum of the metal (M1) ion concentrations be within the above-mentioned range.

When the above-described organic film is treated with the aqueous solution containing the metal (M1) ion, a hydrogen ion of an acid group contained in the organic film is substituted with the metal (M1) ion. To be specific, a hydrogen ion of an acid group such as —COOH or —$SO_3H$ contained in the organic film is directly substituted with the metal (M1) ion, so that a metal salt of an acid group such as —COOM1 or —$SO_3M1$ is produced. Here, M1 denotes a metal atom of the metal (M1) ion (the denotation is applicable in the below description as well).

There is no specific limitation in treating conditions as long as a metal salt of an acid group is produced. The treating temperature generally ranges from 0 to 80° C., preferably from 20 to 50° C., and the treating time (dipping time) generally ranges from 1 to 30 minutes, preferably from 5 to 15 minutes.

Also in a case where an addition polymerizable compound including an acid group contains an ester group, it is possible to convert the acid group into a metal (M1) salt by treating the organic film with an aqueous solution containing the metal (M1) ion as in the above-described case. Furthermore, it is also possible to convert the acid group into the metal (M1) salt by treating the organic film with an aqueous acid solution so as to hydrolyze an ester bond and produce an acid group, and then treating the produced acid group with an aqueous solution containing the metal (M1) ion.

Examples of the "acid aqueous solution" include an aqueous solution of hydrochloric acid, sulfuric acid, nitric acid or acetic acid. A treatment with an aqueous acid solution may easily be executed by, for example, dipping in the aqueous acid solution a substrate or a film on which an organic film has been formed. The concentration of acid may be, for example, 0.1 to 10 M, and preferably 0.5 to 5 M. The treating temperature is, for example, 0 to 80° C., and preferably 20 to 50° C. The treating time (dipping time) in the acid aqueous solution is, for example, 1 to 30 minutes, and preferably 5 to 15 minutes.

In addition, the treatment with the aqueous solution containing the metal (M1) ion of the acid group can easily be executed by dipping in the aqueous solution a substrate or a film on which an acid group has been formed, or by applying the aqueous solution onto a substrate or a film on which an acid group has been formed. The treating temperature may range, for example, from 0 to 80° C., and preferably from 20 to 50° C. The treating time (dipping time) generally ranges from 1 to 30 minutes, and preferably from 5 to 15 minutes.

As described above, in the metal salt generating step, a hydrogen ion of an acid group are substituted with a metal (M1) ion. In a case where a constituent of an organic film includes an addition polymerizable compound including the aforementioned basic group, a surface of the primer composition is further compatible with an aqueous solution containing the metal (M1) ion. Accordingly, a property of the organic film to retain the metal (M1) ion can further be enhanced.

(1-3. Metal Fixing Step)

A metal fixing step is a step of converting the metal (M1) salt of the acid group to a metal (M2) salt by treating an organic film, which has been treated with the aqueous solution containing a metal (M1) ion, with a metal (M2) ion aqueous solution containing a metal (M2) ion having a lower ionization tendency than the metal (M1) ion.

The metal fixing step can easily be executed by, for example, dipping in a metal (M2) ion aqueous solution containing a metal (M2) ion a substrate or a film with an organic film thereon which has been treated with the aqueous solution containing the metal (M1) ion. Or, the step can also be easily executed by applying a metal (M2) ion aqueous solution containing a metal (M2) ion onto a substrate or a film with an organic film thereon which has been treated with the aqueous solution containing a metal (M1) ion.

Because of a lower ionization tendency of a metal (M2) ion than that of a metal (M1) ion, a metal (M1) salt of an acid group contained in the organic film is easily cation-exchanged with a metal (M2) ion, and the metal (M2) ion is introduced and fixed to the organic film.

The metal (M2) is not limited in particular as long as the metal allows the cation exchange. However, the metal (M2) is preferably gold, silver, copper, palladium, tin, or nickel. Moreover, with use of the process of the present invention, it is possible to produce a metal film of indium, platinum, cobalt, iron, or the like.

According to the process of the present invention, there is used the primer composition that contains (i) the addition polymerizable compound including three or more reactive groups and having a bulky structure, (ii) the addition polymerizable compound including an acid group which is excellently retentive of a metal ion, (iii) the addition polymerizable compound including a basic group, and (iv) the addition polymerizable compound including a hydrophilic functional group. Accordingly, gold which is difficult to fix to a substrate or a film by a conventional technique can be appropriately formed into a film. Furthermore, silver, copper, palladium, tin, nickel, or the like can also be appropriately formed into a film. Therefore, the process of the present invention can provide a metal film which can be applied to various uses such as metal wiring or a half mirror.

Moreover, according to the process of the present invention, a metal film can be formed directly into a film without using a catalyst.

The metal (M2) ion aqueous solution is not specifically limited, and may be, for example, an aqueous solution of gold (III) chloride, gold (I) chloride, chloroauric acid, gold acetate, silver nitrate, silver acetate, silver carbonate, silver chloride, copper nitrate, copper sulfate, copper acetate, copper carbonate, copper chloride, palladium chloride, palladium nitrate, palladium acetate, palladium sulfate, indium chloride, indium nitrate, indium acetate, indium sulfate, trans-diaminedichloroplatinum, cobalt chloride, cobalt nitrate, cobalt sulfate, cobalt acetate, iron (II) chloride, iron (III) chloride, iron (III) nitrate, iron (II) sulfate, iron (III) sulfate, nickel chloride, nickel nitrate, nickel sulfate, nickel acetate, tin (II) chloride, tin (IV) chloride, or the like.

The concentration of a metal (M2) ion in the metal (M2) ion aqueous solution is not specifically limited as long as cation exchange is possible. However, the concentration is preferably 5 to 500 mM, and particularly 30 to 250 mM for example.

The treating temperature is not specifically limited as long as cation exchange is possible. However, the temperature is, for example, 0 to 80° C., and preferably 20 to 50° C. The treating time (dipping time) is not specifically limited as long as cation exchange is possible, but it is, for example, 1 to 30 minutes, and preferably 5 to 15 minutes. Moreover, two or more kinds of metal (M2) ions may be used in the present invention. In that case, the sum of the metal (M2) ion concentrations should be within the above-mentioned range.

According to an embodiment of the present invention, it is preferable that the metal (M2) ion aqueous solution contain an alkali metal ion and/or an alkali earth metal ion. As described above, a metal (M2) ion and a metal (M1) ion have a different ionization tendency. By making use of this difference, it is possible to enhance the fixing of a metal (M2) ion to the organic film. An alkali metal and/or an alkali earth metal have a very high ionization tendency. Thus, in this step, ion exchange may further be enhanced by containing an alkali metal ion and/or an alkali earth metal ion in the metal (M2) ion aqueous solution and making use of the difference in the ionization tendency between the metal (M1) ion and the metal (M2) ion in the metal (M2) ion aqueous solution. As a result, the metal (M2) can more effectively be fixed to the organic film.

In particular, by a conventional technique, it has been difficult to directly fix gold to an organic film. However, according to the primer composition and the process of the present invention, it is presumable that the coexistence of an alkali metal ion and/or an alkali earth metal ion having a high ionization tendency and a metal (M1) ion makes it possible to reduce the proportion of gold that exists as an ion. Accordingly, this is supposed to enhance fixing of the gold to the organic film. Of course, not only gold, but also various metals such as silver, copper, palladium, tin, or nickel, can be sufficiently fixed.

The alkali metal and the alkali earth metal may be separately used, or they may be used in combination. In any event, the higher the ionization tendency is, the more preferable. Hence, it is more desirable that the alkali metal be solely used. The kinds of the alkali metal and the alkali earth metal are not specifically limited, but in terms of a high ionization tendency, inexpensive price and ease of use, it is more preferable that sodium or potassium be used.

The amount of the alkali metal and/or the alkali earth metal to be used is not specifically limited as long as the alkali metal and/or the alkali earth metal is compatible with the metal (M2) ion aqueous solution. For example, in a case where gold is used as the metal (M2) and sodium is used as the alkali metal and/or alkali earth metal, it is preferable that a gold ion aqueous solution and sodium as a simple substance be used in a molar ratio of gold to sodium of 1:1. The alkali metal and/or the alkali earth metal may be added to the metal (M2) ion aqueous solution in the form of a salt that can be ionized in the aqueous solution. For example, sodium acetate, sodium carbonate or the like may be used. The alkali metal and/or the alkali earth metal may also be added in the form of an aqueous solution of, for example, potassium hydrate, sodium hydrate or the like.

In an embodiment of the present invention, it is preferable that the metal (M2) ion aqueous solution contain polyol. For the purpose of improving the efficiency of film forming, the metal (M2) ion concentration of the metal (M2) ion aqueous solution should preferably be as high as possible. However, particularly in a case where gold, which has a large specific gravity, is used, a high metal (M2) ion concentration is likely to result in precipitation. The addition of polyol prevents the metal (M2) ion from precipitation and realizes a more smooth cation exchange between the metal (M2) ion and the metal (M1) ion, thereby enhancing fixing of the metal (M2) ion to the organic film.

Meanwhile, in a case where the metal (M2) precipitates despite compatibility between a metal (M2) ion and a solvent, it is generally preferable that the solution be stirred for efficient cation exchange. However, when the metal (M2) ion aqueous solution contains polyol, cation exchange can efficiently be progressed without stirring. This is very advantageous also in terms of improvement of work efficiency.

The number of alcoholic hydroxyl group contained in the polyol is not specifically limited, and may be two or more in a molecule. For example, glycerin, polyethyleneglycol, sorbitol, or the like may be used as the polyol. Among them, glycerin is particularly preferably used, because it is superior in viscosity-enhancing property, an effect of preventing metal (M2) ion precipitation and an effect of enhancing the fixing of a gold ion to the organic film.

In consideration of compatibility with the metal ion aqueous solution, the amount of the polyol to be used is preferably 10 to 80% by weight with respect to the aforementioned metal (M2) ion aqueous solution. The polyol should be mixed into the metal (M2) ion aqueous solution so as to accomplish this concentration.

(1-3. Reducing Step)

A reducing step is a step of forming a metal film on the surface of the organic film by reducing the metal (M2) ions. That is, the metal (M2) ion introduced to the organic film during the metal fixing step is reduced so that a metal atom of the metal (M2) ion is precipitated on the surface of the organic film so as to form a predetermined metal film.

A reduction method may be performed by using, for example, one or more reducing agent selected from a group consisting of (1) ascorbic acid, sodium ascorbate, sodium boron hydroxide, dimethylamine-borane, trimethylamine-borane, citric acid, sodium citrate, tannic acid, diborane, hydrazine, formaldehyde, and lithium aluminum hydride, (2) derivatives of the compounds of (1), and (3) sulfite salt and hypophosphite, and/or one or more reducing means selected from a group consisting of (4) an ultraviolet ray, heat, plasma and hydrogen.

The derivatives are not specifically limited. The (3) sulfite salt and hypophosphite are not specifically limited, either.

A method using a reducing agent may be performed, for example, in such a manner that the metal (M2) ion can be reduced by causing the surface of the organic film to contact with the reducing agent. The reducing agent is generally used in the form of an aqueous solution. Thus, the metal (M2) ion can easily be reduced by dipping in the aqueous solution of the reducing agent a substrate or a film having an organic film thereon.

The concentration of the reducing agent in the aqueous solution of the reducing agent is not specifically limited. However, it is not preferable that the concentration of the reducing agent be too low, because the reaction rate of the reducing tends to be too slow. Likewise, it is not preferable that the concentration of the reducing agent be too high, because the precipitated metal may drop out of the substrate or the film.

Therefore, the concentration of the reducing agent is preferably 1 to 500 mM, and more preferably 5 to 100 mM. The treatment temperature of reduction is not specifically limited, but the temperature of the aqueous solution of the reducing agent should preferably be 0 to 80° C., and more preferably 20 to 50° C. Furthermore, the treatment time of reduction (dipping time) is not specifically limited, but it should preferably be 1 to 30 minutes, and more preferably 5 to 15 minutes.

Moreover, in an embodiment of the present invention, it is preferable that, in the above-described reducing step, an alcohol and/or a surface active agent be used together with the reducing agent. This enhances compatibility between (i) the water-soluble reducing agent and (ii) the primer composition for forming a metal film and a metal wiring pattern, and thus makes it possible to progress the reduction more efficiently.

The alcohol must be amphipathic, because it has to be soluble in the aqueous solution of the reducing agent and, at the same time, be highly compatible with the primer composition used for forming a metal film and metal wiring patterns. As long as it is amphilathic, the alcohol may be any of a chain alcohol, an alicyclic alcohol, or an aromatic alcohol. For example, any of the following may be used: a lower monovalent chain alcohol such as ethanol, methanol, propanol, or butanol; a polyhydric alcohol such as ethylene glycol; or an aromatic alcohol such as benzyl alcohol.

Furthermore, the surface active agent may be any of a cationic surface active agent, an anionic surface active agent, an ampholytic surface active agent, or nonionic surface active agent.

Examples of the cationic surface active agent include: an amine salt such as an alkylamine salt amide-bonded amine salt or an ester-bonded amine salt; a quaternary ammonium salt such as an alkylammonium salt, an amide-bonded ammonium salt, an ester-bonded ammonium salt, or an ether-bonded ammonium salt; a pyridinium salt such as an alkylpyridinium salt, an amide-bonded pyridinium salt, an ether-bonded pyridinium salt; or the like.

The anionic surface active agent may be soap, sulfate oil, an alkyl sulfate salt, an alkyl sulfonate, an alkyl allyl sulfonate, an alkyl naphthalene sulfonate or the like.

Examples of the nonionic surface active agent include: an ethylene oxide surface active agent of alkyl allyl ether type, alkyl ether type, alkylamine type, or the like; a surface active agent of polyhydric alcohol fatty acid ester type such as glycerin fatty acid ester, sorbitan fatty acid ester, and polyethylene glycol fatty acid ester; an surface active agent of polyethylenimine type; a surface active agent of fatty acid alkylolamide type; or the like.

The ampholytic surface active agent may be a combination of a cationic surface active agent and an anionic surface active agent, a combination of a cationic surface active agent or an anionic surface active agent and a nonionic surface active agent, or the like.

The alcohol and the surface active agent may be used separately or in combination. In addition, the number of the kinds of the alcohol and the surface active agent to be used may be one, two or more.

The alcohol and/or the surface active agent should be added to the aqueous solution of the reducing agent before a substrate or a film is dipped in the aqueous solution. In consideration of the compatibility with a metal ion aqueous solution, the amount of the alcohol and/or the surface active agent to be added is preferably 10 to 60% by weight. Alternatively, the alcohol and/or the surface active agent and a primer resin composition may be applied to a substrate or a film. In that case, in consideration of the compatibility with a metal ion aqueous solution, the amount of the alcohol and/or the surface active agent to be used should preferably be 0.01 to 10% by weight.

In a reduction method in which an ultraviolet ray is used, the surface of the organic film should be irradiated with an ultraviolet ray. For example, in a case where an ultraviolet irradiation device PL16-110, manufactured by SEN Lights Corporation, is used, it is preferable that the irradiation time be 10 to 150 minutes, and in particular 60 to 90 minutes. In such a case, the ultraviolet irradiation may be executed with use of a mask so as to form a metal film having a pattern corresponding to the mask. This makes it possible to easily form even a relatively complex metal pattern. It is possible to remove the organic film of other areas than the pattern by dipping it in e.g. a 1% nitric acid aqueous solution or the like.

In a reduction method that makes use of heat (warming), equipment capable of heating such as a hot plate or an oven may be used to reduce the metal (M2) ion. The heating temperature is preferably 150 to 300° C., and the heating time is preferably 5 to 60 minutes.

In the above-described reducing step, the reducing agent may be used in combination with one or more reducing means selected from a group consisting of an ultraviolet ray, heat, plasma, and hydrogen.

In an embodiment of the present invention, when the aforementioned one or more reducing agents selected from the group consisting of the (1), (2) and (3) is used in the above-described reducing step, it is preferable that the metal (M2) ion be reduced in the presence of an alkali metal and/or an alkali earth metal.

An alkali metal and/or an alkali earth metal have a much higher ionization tendency than the metal (M2) used in the present invention. Therefore, reducing the metal (M2) ion in the presence of an alkali metal and/or an alkali earth metal makes it possible to prevent ionization and elution of the metal (M2) that has been fixed to the organic film in the metal fixing step.

That is, the alkali metal and/or the alkali earth metal used in the metal fixing step enhances the fixing of the metal (M2) to the organic film, while the alkali metal and/or the alkali earth metal used in the reducing step prevents the metal (M2) that has been fixed to the organic film from elution and progresses the reducing steadily.

The alkali metal and the alkali earth metal may be separately used, or they may be used in combination. In any event, the higher the ionization tendency is, the more preferable. Hence, it is more desirable that the alkali metal be solely used. The kinds of the alkali metal and the alkali earth metal are not specifically limited, but in terms of a high ionization tendency, inexpensive price and ease of use, it is more preferable that sodium or potassium be used.

The amount of the alkali metal and/or the alkali earth metal to be used is not specifically limited as long as the alkali metal and/or the alkali earth metal is compatible with the metal (M2) ion aqueous solution. For example, in a case where gold is used as the metal (M2) and sodium is used as the alkali metal and/or alkali earth metal, it is preferable that a gold ion aqueous solution and sodium as a simple substance be used in a molar ratio of gold to sodium of 1:1.

The alkali metal and/or alkali earth metal may be added to the aqueous solution of the aforementioned reducing agent in the form of a salt that can be ionized in an aqueous solution. For example, sodium acetate, sodium carbonate or the like may be used. The alkali metal and/or alkali earth metal may also be added to the aqueous solution of the reducing agent in the form of an aqueous solution of, for example, potassium hydrate or sodium hydrate.

Furthermore, in a case where reduction is executed by using one or more means selected from a group consisting of an ultraviolet ray, heat, plasma and hydrogen, an aqueous solution of an alkali metal salt and/or an alkali earth metal salt or an aqueous solution containing an alkali metal and/or an alkali earth metal is prepared. A substrate or a film, which has an organic film to which a metal (M2) is fixed, is dipped in the aqueous solution, followed by a treatment such as an ultraviolet irradiation.

After the completion of the reduction, the substrate or the film is generally washed and dried. Water may be used for the washing, but it is more preferable that, in a case where a reducing agent has been used, the substrate or the film be washed with a sulfuric acid aqueous solution so as to surely remove extra metal ions. The substrate or the film may be left at room temperature for drying, but they may preferably be dried under a nitrogen atmosphere so that the obtained metal film is prevented from being oxidized. Furthermore, in the present invention, it is preferable that the substrate or the film be washed with water between the individual steps or between the individual treatments.

The metal film according to the process of the present invention is obtained through the above-described steps. The thickness of the metal film is not specifically limited, but it may be controlled to be in the range of 10 to 500 nm, for example, and particularly 20 to 200 nm. The thickness of the metal can be controlled by varying e.g. the KOH concentration, the treating temperature and the treating time, by varying the concentration of metal ions, the treating temperature and the treating time, or by varying the concentration of the reducing agent, the treating temperature and the treating time. In addition, the thickness can be measured by a cross-section observation by using, for example, a TEM (transmission electron microscope) (produced by Hitachi High-Technologies Corporation).

According to the process of the present invention: the primer composition has a bulky structure and is excellently retentive of an ion; the metal (M1) ion and the metal (M2) ion are superior in cation exchanging with each other; and it is possible to prevent the fixed metal (M2) ion from being eluted. From this, metal ions of various kinds of metals such as gold, silver, copper, palladium, or nickel can be sufficiently fixed to an organic film. As a result, a metal film having excellent electrical conductivity can be produced. Moreover, in a case where a tin ion is fixed, it is possible to produce a metal film having an excellent property as a half mirror.

The metal film produced by the process of the present invention is useful in the formation of a metal film and metal wiring patterns used as electrodes, minute wiring circuits, a reaction film, or a protection film which are used in the field of such as semiconductors, liquid crystal display panels, various electronic components for high-frequency application or the others, antennas, or sensors. Furthermore, according to the present invention, it is possible to form (i) a metal film for a SPR (surface plasmon resonance) sensor or a SAW (surface acoustic wave) sensor or (ii) a half mirror.

It is possible to produce the above-mentioned electronic components, sensors, electrodes, minute wiring circuits, a reaction film, a protection film and the like by conventionally-known production methods. Such a production method may be, for example, vapor deposition or sputtering.

The present invention is not limited to the description of the embodiments above, but may be altered within the scope of the claims. An embodiment based on a proper combination of technical means disclosed in different embodiments is encompassed in the technical scope of the present invention.

EXAMPLES

Preparation of a Primer Composition and Formation of an Organic Film

In order to provide a primer composition, a chemical liquid in which compounds shown in Table 1 were mixed with one another in such a manner that contents of the compounds amount to 100% by weight was prepared and applied onto acrylic plates by a spin coat method. Then, with use of an ultraviolet irradiation device (PL 16-110, manufactured by SEN Lights Corporation), the acrylic plates were irradiated with an ultraviolet ray for 20 minutes so as to form the organic films A to E thereon. Note that the organic film F shown in Table 1 is commercially available polyimide (Kapton 500H, manufactured by Du Pont-Toray Co., Ltd.) which already has as a form of a film.

As an addition polymerizable compound including three or more reactive groups, pentaerythritol triacrylate (product name: PE-3A, manufactured by Kyoeisha Chemical Co., Ltd.) was used. As an addition polymerizable compound including an acid group, 2-acryloyloxyethyl-phthalic acid (product name: HOA-MPL, manufactured by Kyoeisha Chemical Co., Ltd.) was used. As an addition polymerizable compound including a basic group, dimethylaminoethyl methacrylate (product name: DM, manufactured by Kyoeisha Chemical Co., Ltd.) was used. As an addition polymerizable compound including a hydrophilic functional group, diethylene glycol dimethacrylate (product name: 2EG, manufactured by Kyoeisha Chemical Co., Ltd.) was used.

As a polymerization reaction initiator, IRGACURE 1173 (manufactured by Ciba Specialty Chemicals Co., Ltd.) was used.

As a primer composition for control, polyimide (Kapton 500H, manufactured by Du Pont-Toray Co., Ltd.) was used.

TABLE 1

|  | Ex. 1 | Ex. 2 | Ex. 3 | Ex. 4 | Com. Ex. 1 | Com. Ex. 2 | Com. Ex. 3 | Com. Ex. 4 | Com. Ex. 5 |
|---|---|---|---|---|---|---|---|---|---|
| Organic film | A | A | A | A | B | C | D | E | F |
| Polymerization initiator | 1 | 1 | 1 | 1 | 1 | 1 | 1 | 1 | Polyimide |
| Acrylic acid |  |  |  |  | 99 |  |  |  | (Kapton |
| 2-acryloyloxyethyl-phthalic acid | 49 | 49 | 49 | 49 |  | 99 | 69 |  | 500H) |
| Dimethylaminoethyl methacrylate | 20 | 20 | 20 | 20 |  |  |  | 69 |  |
| Pentaerythritol triacrylate | 15 | 15 | 15 | 15 |  |  | 15 | 15 |  |
| Diethylene glycol dimethacrylate | 15 | 15 | 15 | 15 |  |  | 15 | 15 |  |
| Total (% by weight) | 100 | 100 | 100 | 100 | 100 | 100 | 100 | 100 | 100 |
| Metal ion aqueous solution | 30 mM AuCl$_3$ | 50 mM CuSO$_4$ | 50 mM PdSO$_4$ | 50 mM NiCl$_2$ | 30 mM AuCl$_3$ | ← | ← | ← | ← |
| Sheet resistance after film formation | G | G | G | G | P | P | S | P | P |
| Metal luster | Seen | Seen | Seen | Seen | None | None | Seen | None | None |
| Film thickness (nm) | 140 | 50 | 100 | 110 | — | — | 100 | — | — |

Abbreviations:

"Ex." stands for "Example",

"Com. Ex." for "Comparative Example",

"G" for "Good",

"S" for "Sufficient", and

"P" for "Poor".

Examples 1 to 4 and Comparative Examples 1 to 5

Formation of a Metal Film and Confirmation of Electrical Conductivity

A metal film was obtained by subjecting the acrylic plates, on which the organic films A to E had been formed respectively, to the following steps. Note that the organic film F was not formed on the acrylic plate but directly subjected to the following steps.

(1) The acrylic plate was dipped in a 2 M potassium hydrate aqueous solution at 40° C. and held for 10 minutes.

(2) The acrylic plate was sufficiently washed in distilled water.

(3) The acrylic plate was dipped in a metal ion aqueous solution shown in Table 1 at room temperature and held for 15 minutes.

(4) The acrylic plate was sufficiently washed in distilled water.

(5) The acrylic plate was dipped in a 100 mM sodium boron hydride aqueous solution at 40° C. and held for 15 minutes so as to reduce metal ions.

(6) The acrylic plate was sufficiently washed in distilled water.

(7) The acrylic plate was dried under a nitrogen atmosphere.

In these examples, acrylic plates are used as substrates. However, substrates to be used are not limited to the acrylic plates because, as described above, the process of the present invention can be applied to a substrate which has low heat resistance.

In a case where reduction is performed with use of an ultraviolet ray, a substrate should be irradiated with an ultraviolet ray for 30 minutes by an ultraviolet irradiation device in Step (5). Meanwhile, in a case where thermal reduction is performed, it is preferable to use a substrate with a high heat-resistance property. For example, when a glass substrate is used, the surface of the glass substrate should be modified in advance by using a silane coupling agent such as KBM 5103 (manufactured by Shin-Etsu Chemical Co., Ltd.) prior to forming an organic film. Then, in Step (5), the glass substrate is put into an oven maintained at 200° C. and held for 10 minutes.

An electrical conductivity was assessed by measuring surface resistivity by using a resistivity meter (LORESTA-GP, manufactured by Mitsubishi Chemical Corporation), and rated as follows: if the surface resistivity is less than 1 $\Omega$/square, it is represented by "G" (meaning "good electrical conductivity"); if the surface resistivity is not less than 1 $\Omega$/square and less than 100 $\Omega$/square, it is represented by "S" (meaning "sufficient electrical conductivity"); and if the surface resistivity is 1 k$\Omega$/square or more, it is represented by "P" (which stands for "poor electrical conductivity").

Metal luster is represented by "Seen" (indicating metal luster was seen) or "None" (indicating metal luster was not seen) as results of visual observation.

As shown by Comparative Examples 1, 2, 4, and 5 in Table 1, neither an electrical conductivity nor luster of the metal film was obtained in cases where only polyimide was used as a primer composition, where only acrylic acid was used as a primer composition, where only 2-acryloyloxyethyl-phthalic acid was used as a primer composition, and where dimethylaminoethyl methacrylate, pentaerythritol triacrylate and diethylene glycol dimethacrylate were used as a primer composition.

As shown by Comparative Example 3, in a case where 2-acryloyloxyethyl-phthalic acid, pentaerythritol triacrylate and diethylene glycol dimetacrylate were used as a primer composition, a sufficient electrical conductivity of 1 $\Omega$/square to 100 $\Omega$/square and luster of gold were obtained.

This is presumably because: a phthalic acid group (which is an acid group whose acidity is stronger than that of an acrylic acid) of the 2-acryloyloxyethyl-phthalic acid excellently retained a potassium ion; a lot of gold ions were fixed in the organic film due to the bulky structure of the pentaerythritol triacrylate; and the processing solvents, the aqueous solution containing a potassium ion, the gold ion aqueous solution, and the sodium boron hydride acted inside the organic film due to improvement of hydrophilicity of the organic film by the diethylene glycol dimethacrylate.

On the other hand, as indicated in Comparative Example 4, the organic film, which was produced with use of the primer composition including dimethylaminoethyl methacrylate instead of 2-acryloyloxyethyl-phthalic acid did not show sufficient electrical conductivity or metal luster. Accordingly, it is presumable that (i) an addition polymerizable compound including an acid group is essential for improvement of electrical conductivity and luster, and (ii) the acid group needs to be used as a metal (M1) salt.

As indicated by Examples 1 through 4 in Table 1, in a case where the primer composition in which 2-acryloyloxyethyl-phthalic acid (i.e., an addition polymerizable compound including an acid group) was partially substituted with dimethylaminoethyl methacrylate (i.e., addition polymerizable compound including a basic group), the respective metal films of gold, copper, palladium, and nickel showed sufficient electrical conductivity and metal luster.

Therefore, it was proved that a metal (M1) salt generating effect of the addition polymerizable compound including an acid group can be reinforced by adding the addition polymerizable compound including a basic group to the primer composition.

Example 5

Production of a Metal Film which does not have Electrical Conductivity

A metal film was obtained by subjecting the acrylic plate, on which the organic film A had been formed, to the following steps.

(1) The acrylic plate was dipped in a 2 M potassium hydroxide aqueous solution at 40° C. and held for 10 minutes.

(2) The acrylic plate was sufficiently washed in distilled water.

(3) At room temperature, the acrylic plate was dipped in a 100 mM of $SnCl_2$ aqueous solution and held for 10 minutes.

(4) The acrylic plate was sufficiently washed in distilled water.

(5) The acrylic plate was dipped in a 100 mM sodium boron hydride aqueous solution at 40° C. and held for 10 minutes.

(6) The acrylic plate was sufficiently washed in distilled water.

Through the steps, a tin film which has metal luster and a thickness of approximately 100 nm but does not have electrical conductivity was obtained. The tin film can be used as a half mirror because the tin film has a property of partially reflecting and partially transmitting incident light. Moreover, in forming the tin film, it is not necessary to apply heat or energy to a substrate, whereby the substrate is not subjected to a large load, unlike sputtering or thermal transfer. Accordingly, even in a case where a resin is used as the substrate, it is possible to form a half mirror which is hardly warped.

Example 6

The primer compositions used in Examples 1 through 4 were applied to acrylic plates through a #350-mesh plate having a pattern of 100 μm line-and-space by a printing apparatus (model: MT-320TV, manufactured by Micro-tec Co., Ltd.). Then, the acrylic plates were irradiated with ultraviolet rays for 20 minutes with use of an ultraviolet irradiation device (PL16-110, manufactured by SEN Lights Corporation). Thereby, organic films having wiring pattern were obtained on the acrylic plates.

Then, the acrylic plates on which the organic films are formed were subjected to the steps shown by (1) through (7) in [Examples 1 through 4 and Comparative Examples 1 through 5] with use of 30 mM $AuCl_3$ as a metal ion aqueous solution. Thereby, Au films each of which had a wiring pattern and a film thickness of approximately 100 nm were obtained.

As described above, according to the process of the present invention, metal wiring can be easily obtained without using a photolithographic method.

Example 7

The primer compositions used in Examples 1 through 4 were dripped on acrylic plates, then molds, each of which had a fine array shape, were placed on each of the primer compositions so that faces on each of which the fine array shape (line-and-space widths are 1 μm to 5 μm) was formed contacted with the resins. Then, glass slides were irradiated with ultraviolet rays upward from under the glass slides, so that the primer resins were cured by the ultraviolet rays through the glass slides. Then, the molds were removed, whereby primer resin compositions each of which had a fine shape were obtained on the glass slides.

Glass slides were placed on the primer compositions for fixing the primer compositions. Then the glass slides were irradiated with ultraviolet rays for 20 minutes with use of an ultraviolet irradiation device (PL16-110, manufactured by SEN Lights Corporation). After the irradiation, the glass slides were removed from molds, whereby primer compositions each of which had a patterned shape were obtained on the glass slides. The glass slides were subjected to the steps shown by (1) through (7) in [Examples 1 through 4 and Comparative Examples 1 through 5] with use of 30 mM $AuCl_3$ as a metal ion aqueous solution. Thereby, Au films each of which had a wiring pattern and a film thickness of approximately 100 nm were obtained.

As described above, according to the process of the present invention, metal wiring can be easily obtained without using a photolithographic method.

As described above, the process of a metal film of the present invention includes the steps of: (a) forming an organic film by (i) applying a primer composition to a substrate or a film and thereafter (ii) polymerizing the primer composition, the primer composition containing (i) an addition polymerizable compound including three or more reactive groups, (ii) an addition polymerizable compound including an acid group, (iii) an addition polymerizable compound including a basic group, and (iv) an addition polymerizable compound including a hydrophilic functional group; (b) forming a metal (M1) salt from the acid group by processing the organic film with an aqueous solution containing a metal (M1) ion; (c) substituting the metal (M1) salt of the acid group with a metal (M2) salt by processing the organic film, which has been processed with the aqueous solution containing the metal (M1) ion, with a metal (M2) ion aqueous solution containing a metal (M2) ion which has a less ionization tendency than the metal (M1) ion; and (d) reducing the metal (M2) ion so that a metal film is formed on a surface of the organic film.

Therefore, the present invention yields an effect of cheaply and efficiently forming, without using a catalyst, a metal thin film having a thickness from tens of nanometers to hundreds of nanometers directly on an arbitrary substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

According to the process for producing a metal film of the present invention, various metals may be efficiently fixed to an organic film and reduced. Therefore, a metal film (metal thin film) with a thickness of tens to hundreds nm that is superior in electrical conductivity can be provided at a low cost without using a catalyst. Therefore, the present invention can widely be used in various electronic industry, by being applied to (i) a half mirror or (ii) metal films used for electrodes, minute wiring circuits, a reaction film, a protection film, a SPR sensor, or a SAW sensor, which are used in the field of such as semiconductors, liquid crystal display panels, various electronic components for high-frequency application or the others, antennas, or sensors.

The invention claimed is:

1. A process for producing a metal film, comprising the steps of:
    (a) forming an organic film by (i) applying a primer composition to a substrate or a film and thereafter (ii) polymerizing the primer composition, the primer composition containing (i) an addition polymerizable compound including three or more reactive groups, (ii) an addition polymerizable compound including an acid group, (iii) an addition polymerizable compound including a basic group, and (iv) an addition polymerizable compound including a hydrophilic functional group;
    (b) forming a metal (M1) salt from the acid group by processing the organic film with an aqueous solution containing a metal (M1) ion;
    (c) substituting the metal (M1) salt of the acid group with a metal (M2) salt by processing the organic film, which has been processed with the aqueous solution containing the metal (M1) ion, with a metal (M2) ion aqueous solution containing a metal (M2) ion which has a less ionization tendency than the metal (M1) ion; and
    (d) reducing the metal (M2) ion so that a metal film is formed on a surface of the organic film, in the step (d), the metal (M2) ion being reduced in the presence of an alkali metal and/or an alkaline earth metal.

2. The process as set forth in claim 1, wherein the acid group includes one or more functional groups selected from a group consisting of a carboxyl group, a sulfonic acid group, a phenolic group, a benzoic acid group, a phthalic acid group, a salicylic acid group, an acetylsalicylic acid group, and a benzenesulfonic acid group.

3. The process as set forth in claim 1, wherein the basic group includes one or more functional groups selected from a group consisting of an amino group, a pyridyl group, a morpholino group, and an anilino group.

4. The process as set forth in claim 1, wherein at least one of the reactive groups includes an acryloyl group and/or a methacryloyl group.

5. The process as set forth in claim 1, wherein the hydrophilic functional group includes an ethylene oxide group and/or a propylene oxide group.

6. The process as set forth in claim 1, wherein the metal (M1) is potassium or sodium.

7. The process as set forth in claim 1, wherein the metal (M2) is gold, silver, copper, palladium, tin, or nickel.

8. The process as set forth in claim 1, wherein in the step (d), the metal (M2) ion is reduced with use of (i) one or more reducing agents selected from a group consisting of
(1) ascorbic acid, sodium ascorbate, sodium boron hydride, dimethylamine-borane, trimethylamine-borane, citric acid, sodium citrate, tannic acid, diborane, hydrazine, formaldehyde, and lithium hydride aluminum,
(2) a derivative of each of the compounds in (1), and
(3) sulfite salt and hypophosphite, and/or (ii) one or more reducing means selected from a group consisting of (4) an ultraviolet ray, heat, plasma, and hydrogen.

9. The process as set forth in claim 8, wherein in the step (d), the reducing agent is used together with alcohol and/or a surface active agent.

10. The process as set forth in claim 1, wherein in the step (a), the organic film is given a shape by printing or nanoimprinting.

11. The process as set forth in claim 9, wherein in the step (a), the organic film is given a shape by printing or nanoimprinting.

12. The process as set forth in claim 1,
wherein the step of substituting the metal (M1) salt of the acid group with a metal (M2) salt by processing the organic film, which has been processed with the aqueous solution containing the metal (M1) ion with a metal (M2) ion aqueous solution containing a metal (M2) ion which has a less ionization tendency than the metal (M1) ion and containing an alkali metal ion and/or an alkaline earth metal ion.

* * * * *